(12) United States Patent
Sang et al.

(10) Patent No.: US 8,995,162 B2
(45) Date of Patent: Mar. 31, 2015

(54) RADIATION-HARDENED MEMORY STORAGE UNIT

(71) Applicant: Huazhong University of Science and Technology, Wuhan (CN)

(72) Inventors: Hongshi Sang, Wuhan (CN); Wen Wang, Wuhan (CN); Tianxu Zhang, Wuhan (CN); Chaobing Liang, Wuhan (CN); Jing Zhang, Wuhan (CN); Yang Xie, Wuhan (CN); Yajing Yuan, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 14/135,617

(22) Filed: Dec. 20, 2013

(65) Prior Publication Data

US 2015/0062994 A1    Mar. 5, 2015

(30) Foreign Application Priority Data

Sep. 4, 2013    (CN) .......................... 2013 1 0398912

(51) Int. Cl.
  *G11C 5/06*    (2006.01)
(52) U.S. Cl.
  CPC ...................................... *G11C 5/063* (2013.01)
  USPC ............................................................ 365/72
(58) Field of Classification Search
  USPC ...................................................... 365/63–72
  See application file for complete search history.

(56) References Cited

U.S. PATENT DOCUMENTS

| | | | |
|---|---|---|---|
| 4,887,236 A * | 12/1989 | Schloemann | 365/173 |
| 5,315,544 A * | 5/1994 | Yokote et al. | 365/154 |
| 6,744,661 B1 * | 6/2004 | Shubat | 365/156 |
| 6,917,533 B2 * | 7/2005 | Gardner et al. | 365/94 |
| 6,990,010 B1 * | 1/2006 | Plants | 365/189.15 |
| 2005/0219891 A1 * | 10/2005 | Gardner et al. | 365/104 |
| 2007/0242537 A1 * | 10/2007 | Golke et al. | 365/194 |
| 2008/0094896 A1 * | 4/2008 | Erickson et al. | 365/185.09 |

\* cited by examiner

*Primary Examiner* — Harry W Byrne
(74) *Attorney, Agent, or Firm* — Matthias Scholl P.C.; Matthias Scholl (57) ABSTRACT

A radiation-hardened memory storage unit that is resistant to total ionizing done effects, the unit including PMOS transistors.

6 Claims, 6 Drawing Sheets

RADIATION-HARDENED MEMORY STORAGE UNIT

CROSS-REFERENCE TO RELATED APPLICATIONS

Pursuant to 35 U.S.C. §119 and the Paris Convention Treaty, this application claims the benefit of Chinese Patent Application No. 201310398912.4 filed Sep. 4, 2013, the contents of which are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a radiation-hardened memory storage unit that is resistant to total ionizing dose effects.

2. Description of the Related Art

In aerospace electronic systems, the memory is a very important part occupying most of the chip area. In the space environment, an electronic system suffers radiations from the Galaxy, the Sun, the Earth and other radiators. Therefore, the memory is one of the most vulnerable parts in an aerospace electronic system for its high density.

The total ionizing dose radiation is one of the most important radiation effects suffered by the memory. In the 0.18 um process and advanced processes, as the gate oxide thickness is less than 5 nm, the threshold drift of a MOS transistor caused by the total ionizing dose radiation suffered by the gate oxide is negligible, and the leakage current caused by the total ionizing dose radiation suffered by the field oxide in an NMOS transistor is the main effect.

Figure 1:
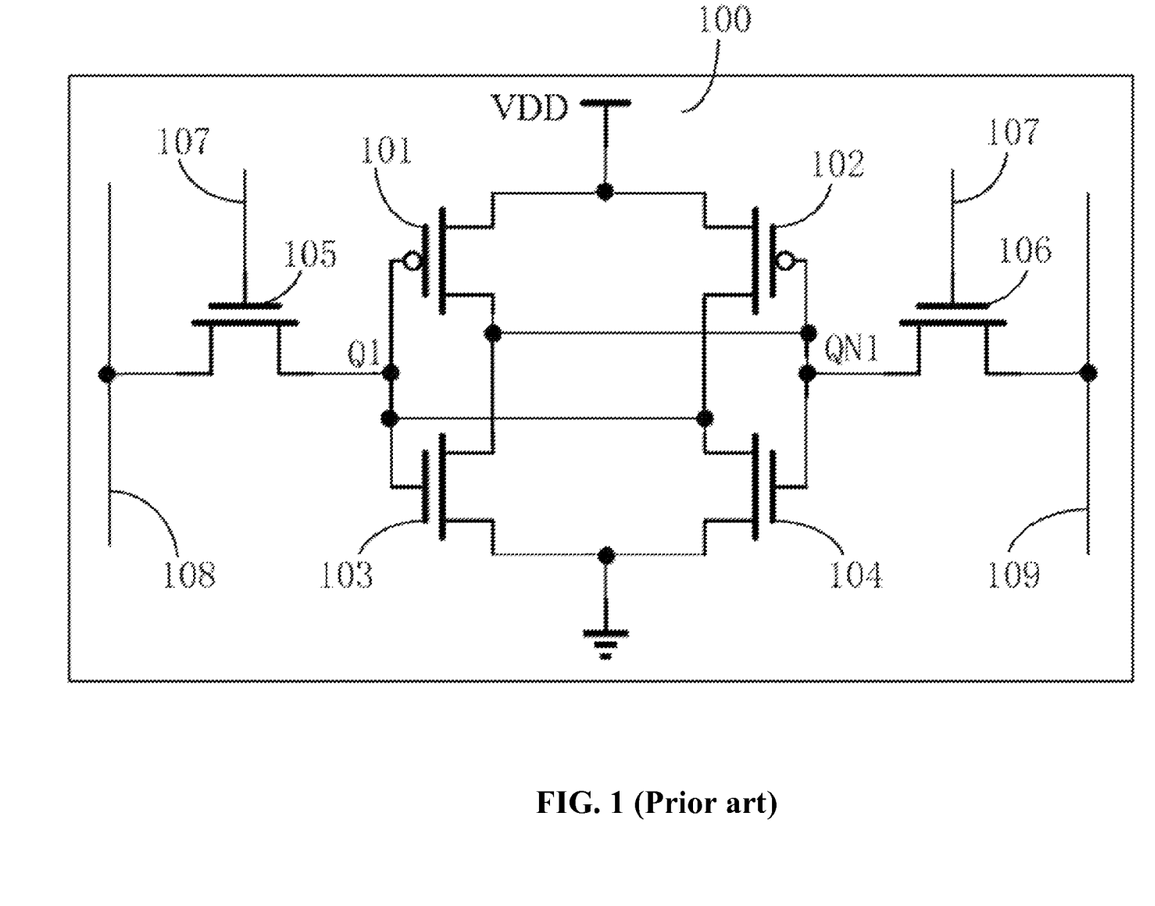
FIG. 1 is a schematic diagram of a typical storage unit of prior art.

A conventional memory storage unit is shown in FIG. 1 which illustrates a static random access memory (SRAM) containing six transistors. A PMOS transistor 101 and a PMOS transistor 102 are pull-up transistors, an NMOS transistor 103 and an NMOS transistor 104 are pull-down transistors, and an NMOS transistor 105 and an NMOS transistor 106 are access transistors. The PMOS transistor 101 and the NMOS transistor 103 form an inverter, the PMOS transistor 102 and the NMOS transistor 104 form another inverter, and the two inverters are cross-coupled to lock the storage levels of a storage node Q1 and a storage node QN1. Access to the memory storage unit in FIG. 1 is controlled by a word line 107. Specifically, when the word line 107 is high level, data are written into the storage nodes Q1 and QN1 through a bit line 108 and a bit line 109, or data are read out from the storage nodes Q1 and QN1 through the bit lines 108 and 109.

Figure 2:
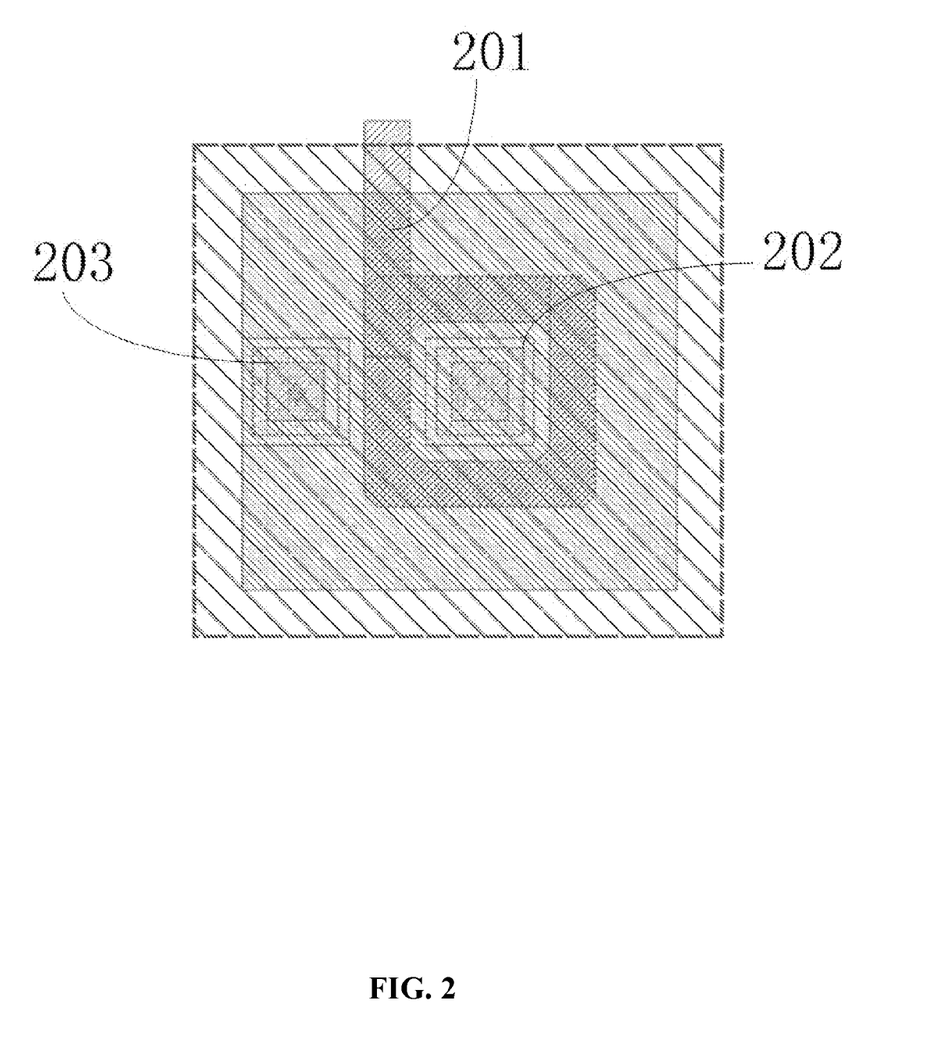
FIG. 2 is a schematic diagram of hardening an NMOS transistor by an annular FET layout.
Figure 3:
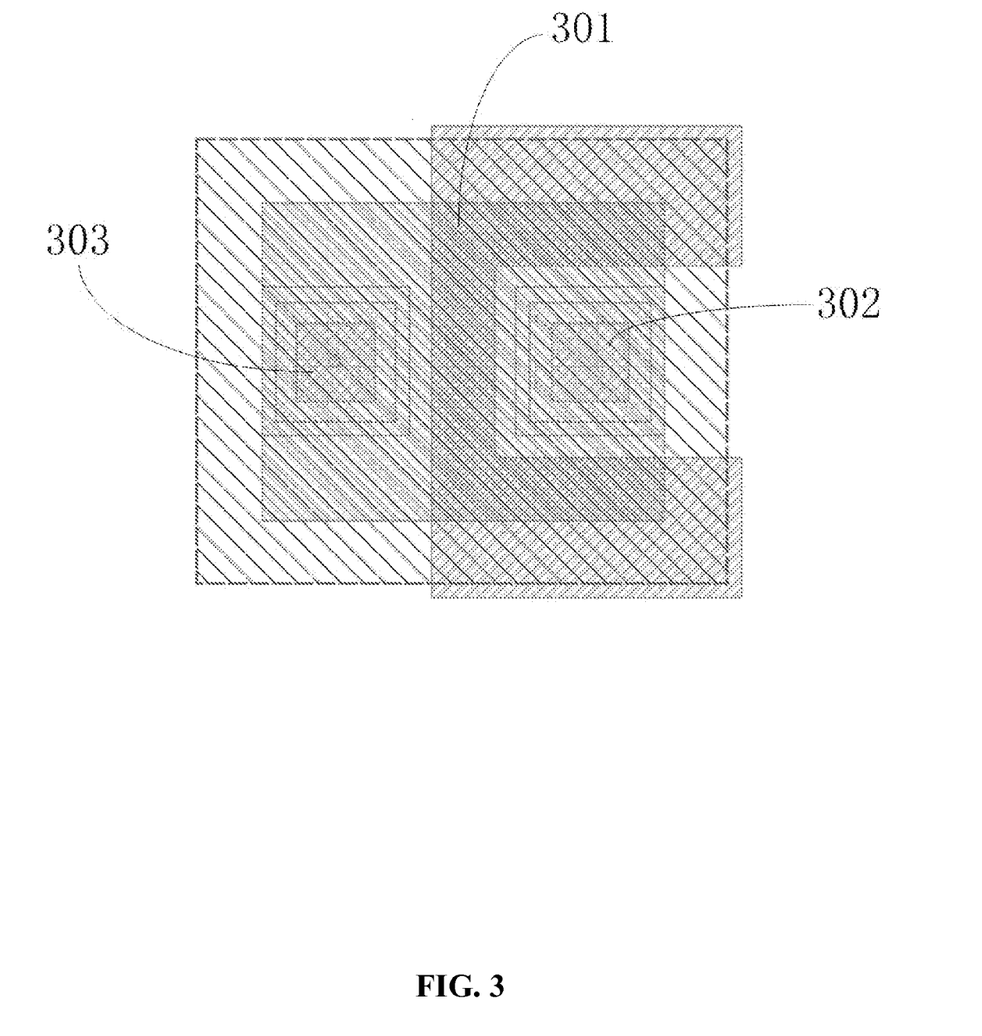
FIG. 3 is a schematic diagram of hardening an NMOS transistor by a horseshoe FET layout.

The memory storage unit shown in FIG. 1 is mainly realized by total ionizing dose radiation hardening via the NMOS transistors with the particular gate shapes in FIG. 2 and FIG. 3. An NMOS transistor is hardened by an annular FET layout in FIG. 2. Specifically, one of a drain 202 and a source 203 is completely surrounded by a gate 201 so as to cut off the channel of the leakage current physically to realize total ionizing dose radiation hardening. An NMOS transistor is hardened by a horseshoe FET layout in FIG. 3. Specifically, one of a drain 302 and a source 303 is semi-surrounded by a gate 301 so as to extend the channel length of the leakage current to reduce the leakage current caused by the total ionizing dose radiation to realize total ionizing dose radiation hardening.

However, methods for hardening total ionizing dose radiation in FIG. 2 and FIG. 3 may result in a substantial increase in storage unit area.

SUMMARY OF THE INVENTION

It is an objective of the invention to provide a radiation hardened memory storage unit that is resistant to total ionizing dose effects and has a small storage unit area.

To achieve the above objective, in accordance with one embodiment of the invention, there is provided a radiation-hardened memory storage unit that is resistant to total ionizing dose effects. The radiation-hardened memory storage unit that is resistant to total ionizing dose effects comprises PMOS transistors.

In a class of this embodiment, the radiation-hardened memory storage unit that is resistant to total ionizing dose effects comprises a first PMOS transistor, a second PMOS transistor, a third PMOS transistor, a fourth PMOS transistor, a fifth PMOS transistor, and a sixth PMOS transistor.

The first PMOS transistor and the second PMOS transistor are pull-up transistors; a source of the first PMOS transistor is coupled to a voltage VDD, a gate of the first PMOS transistor is coupled to an reverse storage node, and a drain of the first PMOS transistor is coupled to a storage node; and a source of the second PMOS transistor is coupled to the voltage VDD, a gate of the second PMOS transistor is coupled to the storage node, and a drain of the second PMOS transistor is coupled to the reverse storage node.

The third PMOS transistor and the fourth PMOS transistor are read-out access transistors; a source of the third PMOS transistor is coupled to a read selecting word line, a gate of the third PMOS transistor is coupled to the storage node, and a drain of the third PMOS transistor is coupled to a first read-out bit line; and a source of the fourth PMOS transistor is coupled to the read selecting word line, a gate of the fourth PMOS transistor is coupled to the reverse storage node, and a drain of the fourth PMOS transistor is coupled to a second read-out bit line.

The fifth PMOS transistor and the sixth PMOS transistor are write-in access transistors; a source of the fifth PMOS transistor is coupled to the storage node, a gate of the fifth PMOS transistor is coupled to a write selecting word line, and a drain of the fifth PMOS transistor is coupled to a first write-in bit line; and a source of the sixth PMOS transistor is coupled to the reverse storage node, a gate of the sixth PMOS transistor is coupled to the write selecting word line, and a drain of the sixth PMOS transistor is coupled to a second write-in bit line.

In a class of this embodiment, an aspect ratio of each of the first PMOS transistor and the second PMOS transistor is proportional to the retention time of the memory storage unit.

In a class of this embodiment, the radiation-hardened memory storage unit that is resistant to total ionizing dose effects comprises a first PMOS transistor, a second PMOS transistor, a third PMOS transistor and a fourth PMOS transistor.

The first PMOS transistor and the second PMOS transistor are read-out access transistors; a source of the first PMOS transistor is coupled to a read selecting word line, a gate of the first PMOS transistor is coupled to a storage node, and a drain of the first PMOS transistor is coupled to a first read-out bit line; and a source of the second PMOS transistor is coupled to the read selecting word line, a gate of the second PMOS transistor is coupled to an reverse storage node, and a drain of the second PMOS transistor is coupled to a second read-out bit line.

The third PMOS transistor and the fourth PMOS transistor are write-in access transistors; a source of the third PMOS transistor is coupled to the storage node, a gate of the third PMOS transistor is coupled to a write selecting word line, and a drain of the third PMOS transistor is coupled to a first write-in bit line; and a source of the fourth PMOS transistor is coupled to the reverse storage node, a gate of the fourth PMOS transistor is coupled to the write selecting word line, and a drain of the fourth PMOS transistor is coupled to a second write-in bit line.

In a class of this embodiment, the aspect ratio of each of the third PMOS transistor and the fourth PMOS transistor is proportional to the retention time of the memory storage unit.

In a class of this embodiment, the radiation-hardened memory storage unit that is resistant to total ionizing dose effects comprises a first PMOS transistor, a second PMOS transistor, a third PMOS transistor, and a fourth PMOS transistor.

The first PMOS transistor and the second PMOS transistor are pull-up transistors; a source of the first PMOS transistor is coupled to a voltage VDD, a gate of the first PMOS transistor is coupled to an reverse storage node, and a drain of the first PMOS transistor is coupled to a storage node; and a source of the second PMOS transistor is coupled to the voltage VDD, a gate of the second PMOS transistor is coupled to the storage node, and a drain of the second PMOS transistor is coupled to the reverse storage node; and The third PMOS transistor and the fourth PMOS transistor are access transistors; a source of the third PMOS transistor is coupled to the storage node, a gate of the third PMOS transistor is coupled to an access selecting word line, and a drain of the third PMOS transistor is coupled to a first bit line; and a source of the fourth PMOS transistor is coupled to the reverse storage node, a gate of the fourth PMOS transistor is coupled to the access selecting word line, and a drain of the fourth PMOS transistor is coupled to a second bit line.

In a class of this embodiment, an aspect ratio of each of the first PMOS transistor and the second PMOS transistor is proportional to the retention time of the memory storage unit.

Advantages of the invention are as follows. Firstly, total ionizing dose radiation hardening can be realized automatically in a small storage unit area. As the memory storage unit of the invention is formed by PMOS transistors and the majority carrier in the substrate of a PMOS transistor is the electron, the leakage current channel cannot be formed between the drain and the source of a PMOS transistor by the total ionizing dose radiation and no leakage current exists, and therefore, the total ionizing dose radiation hardening is not necessary for a PMOS transistor. Secondly, the circuit is simple and can be realized directly by commercial CMOS processes without any changes to the existing processes.

DETAILED DESCRIPTION OF THE EMBODIMENTS

To further illustrate the invention, experiments detailing a radiation-hardened memory storage unit that is resistant to total ionizing dose effects are described below. It should be noted that the following examples are intended to describe and not to limit the invention.

Figure 4:
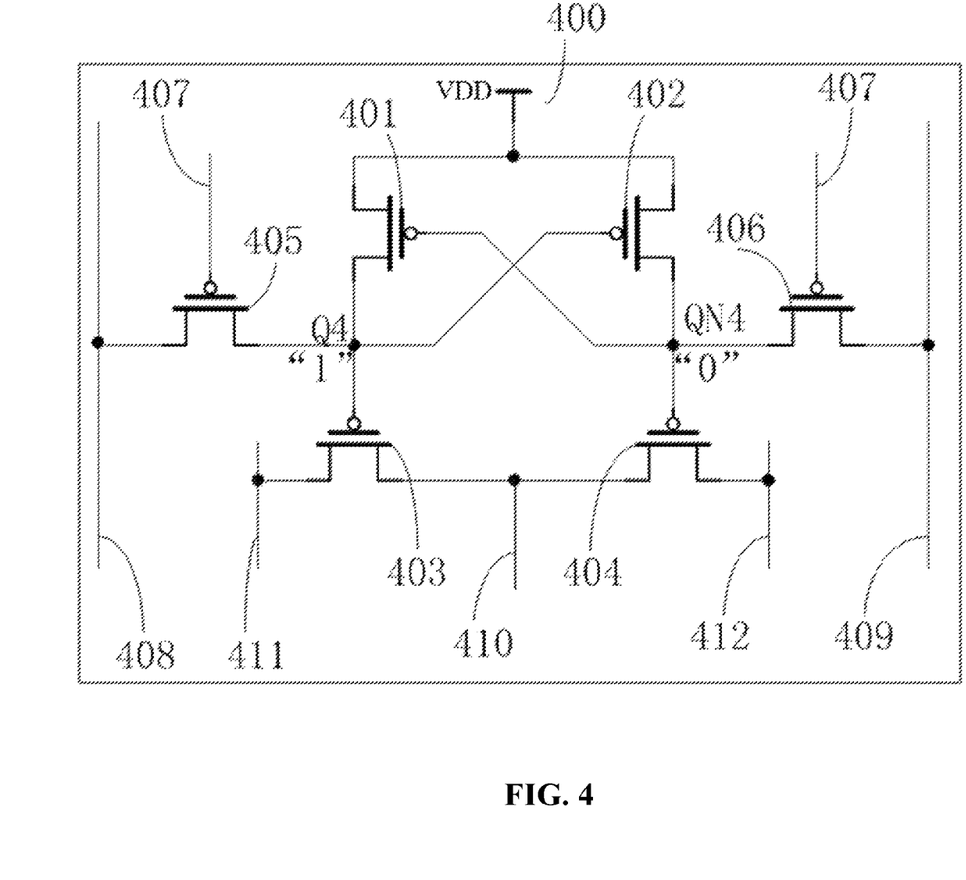
FIG. 4 is a schematic diagram of a radiation-hardened memory storage unit that is resistant to total ionizing dose effects according to one embodiment of the present invention.

FIG. 4 is a schematic diagram of a radiation-hardened memory storage unit that is resistant to total ionizing dose effects according to one embodiment of the present invention. As in FIG. 4, a storage unit 400 comprises six PMOS transistors 401-406, and the substrates of all the six PMOS transistors are coupled to a voltage VDD.

A first PMOS transistor 401 and a second PMOS transistor 402 are pull-up transistors. A source of the first PMOS transistor 401 is coupled to a voltage VDD, a gate of the first PMOS transistor 401 is coupled to a reverse storage node QN4, and a drain of the first PMOS transistor 401 is coupled to a storage node Q4. A source of the second PMOS transistor 402 is coupled to the voltage VDD, a gate of the second PMOS transistor 402 is coupled to the storage node Q4, and a drain of the second PMOS transistor 402 is coupled to the reverse storage node QN4.

A third PMOS transistor 403 and a fourth PMOS transistor 404 are read-out access transistors. A source of the third PMOS transistor 403 is coupled to a read selecting word line 410, a gate of the third PMOS transistor 403 is coupled to the storage node Q4, and a drain of the third PMOS transistor 403 is coupled to a first read-out bit line 411. A source of the fourth PMOS transistor 404 is coupled to the read selecting word line 410, a gate of the fourth PMOS transistor 404 is coupled to the reverse storage node QN4, and a drain of the fourth PMOS transistor 404 is coupled to a second read-out bit line 412.

A fifth PMOS transistor 405 and a sixth PMOS transistor 406 are write-in access transistors. A source of the fifth PMOS transistor 405 is coupled to the storage node Q4, a gate of the fifth PMOS transistor 405 is coupled to a write selecting word line 407, and a drain of the fifth PMOS transistor 405 is coupled to a first write-in bit line 408. A source of the sixth PMOS transistor 406 is coupled to the reverse storage node QN4, a gate of the sixth PMOS transistor 406 is coupled to the write selecting word line 407, and a drain of the sixth PMOS transistor 406 is coupled to a second write-in bit line 409.

During the write operation of the memory storage unit 400, the write selecting word line 407 is set to low level GND so that data of the first write-in bit line 408 are written into the storage node Q4 and data of the second write-in bit line 409 are written into the reverse storage node QN4. When a write operation is not performed, the write selecting word line 407 is set to high level VDD, and both the first write-in bit line 408 and the second write-in bit line 409 are pulled down to low level GND.

Assume current data stored in the memory storage unit 400 is "1", namely the storage node Q4 is high level "1" and the reverse storage node QN4 is low level "0".

During the read operation of the memory storage unit 400, the read selecting word line 410 is set to high level VDD. As the reverse storage node QN4 is low level "0", the fourth PMOS transistor 404 is opened and the read selecting word line 410 charges the second read-out bit line 412 through the fourth PMOS transistor 404. Meanwhile, as the storage node Q4 is high level "1", the third PMOS transistor 403 is cut off and the read selecting word line 410 is unable to charge the first read-out bit line 411. Therefore, a voltage difference is generated between the first read-out bit line 411 and the second read-out bit line 412, which is sensed by a peripheral control circuit and read out.

The read operation of the memory storage unit 400 is non-destructive, namely the data stored in the memory storage unit 400 are not to be destroyed by the read operation of The memory storage unit 400. Therefore, a write-back operation is not necessary after the read operation. When the read operation is finished, the read selecting word line 410 is set to low level GND, and both the first read-out bit line 411 and the second read-out bit line 412 are pulled down to low level GND.

During the data maintaining of the memory storage unit 400, as the reverse storage node QN4 is low level "0", the first PMOS transistor 401 is opened and the storage node Q4 is locked at the voltage VDD. As a result, it is impossible to open the second PMOS transistor 402 and unable to lock the reverse storage node QN4. More specifically, as the source of the second PMOS transistor 402 is high level VDD, the gate of the second PMOS transistor 402 is high level VDD, and the drain of the second PMOS transistor 402 is low level, the second PMOS transistor 402 is cut off, a sub-threshold current from the source to the drain of the second PMOS transistor 402 is generated, and the sub-threshold current flows from the drain of the second transistor 402 to the reverse storage node QN4. As the source of the sixth PMOS transistor 406 is low level "0", the gate of the sixth PMOS transistor 406 is high level VDD, and the drain of the sixth PMOS transistor 406 is low level GND, the sub-threshold current of the sixth PMOS transistor 406 flows from the reverse storage node QN4 to the second write-in bit line 409. Because of different bias voltages, the sub-threshold current of the sixth PMOS transistor 406 flowing from the reverse storage node QN4 is smaller than the sub-threshold current of the second PMOS transistor 402 flowing to the reverse storage node QN4, which makes the level of the reverse storage node QN4 increase gradually. Therefore, a periodic refresh is required for the memory storage unit 400 to prevent the data in the memory storage unit 400 from being unreadable as a result of attenuation.

In order to prolong the data maintaining time of the memory storage unit 400 before expiration, an aspect ratio of both the first PMOS transistor 401 and the second PMOS transistor 402 should be designed as smaller as possible, so as to reduce the sub-threshold current of the first PMOS transistor 401 flowing to the storage node Q4 and the sub-threshold current of the second PMOS transistor 402 flowing to the reverse storage node QN4.

The memory storage unit 400 is a dual port pseudo-static storage unit half-locking the stored data functionally. Compared with a conventional dual port SRAM, the number of the transistors of the memory storage unit 400 is reduced by 25%.

Figure 5:
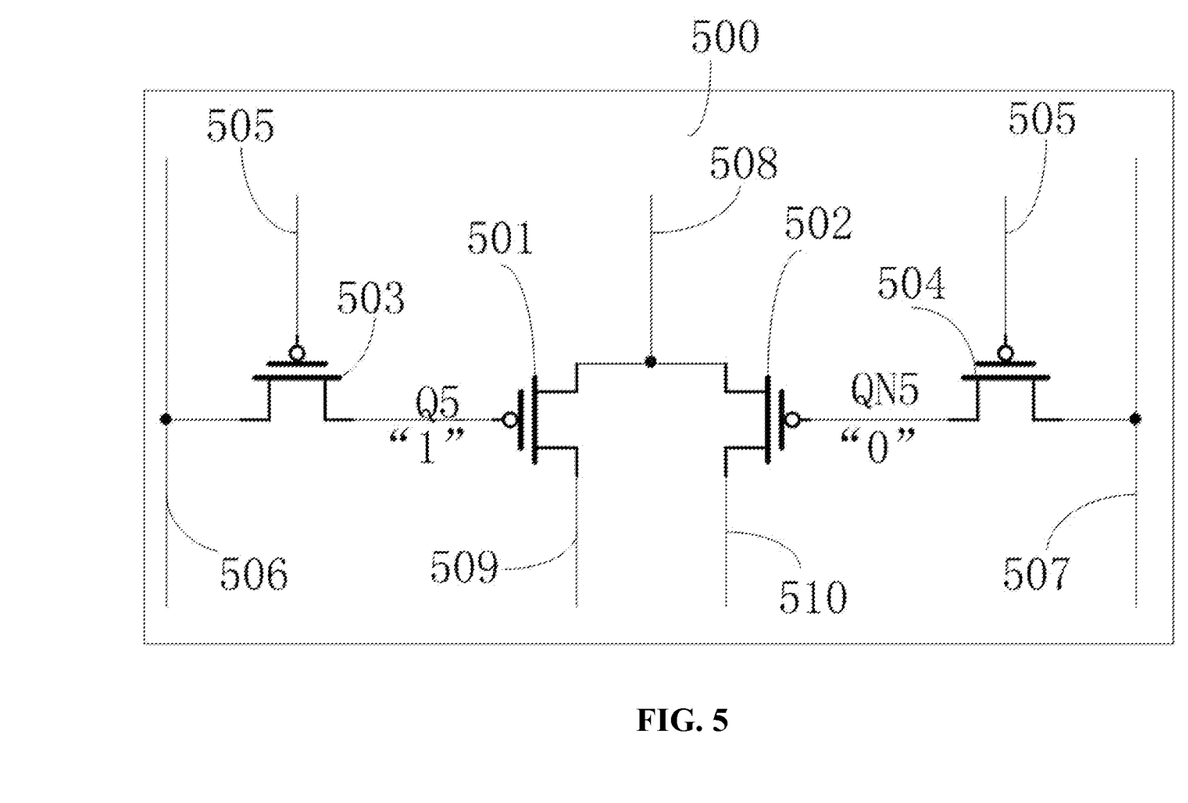
FIG. 5 is a schematic diagram of a radiation-hardened memory storage unit that is resistant to total ionizing dose effects according to another embodiment of the present invention.

FIG. 5 is a schematic diagram of a radiation-hardened memory storage unit that is resistant to total ionizing dose effects according to another embodiment of the present invention. As in FIG. 5, a storage unit 500 comprises 4 PMOS transistors 501-504, and the substrates of all the 4 PMOS transistors are coupled to a voltage VDD.

A first PMOS transistor 501 and a second PMOS transistor 502 are read-out access transistors. A source of the first PMOS transistor 501 is coupled to a read selecting word line 508, a gate of the first PMOS transistor 501 is coupled to a storage node Q5, and a drain of the first PMOS transistor 501 is coupled to a first read-out bit line 509. A source of the second PMOS transistor 502 is coupled to the read selecting word line 508, a gate of the second PMOS transistor 502 is coupled to a reverse storage node QN5, and a drain of the second PMOS transistor 502 is coupled to a second read-out bit line 510.

A third PMOS transistor 503 and a fourth PMOS transistor 504 are write-in access transistors. A source of the third PMOS transistor 503 is coupled to the storage node Q5, a gate of the third PMOS transistor 503 is coupled to a write selecting word line 505, and a drain of the third PMOS transistor 503 is coupled to a first write-in bit line 506. A source of the fourth PMOS transistor 504 is coupled to the reverse storage node QN5, a gate of the fourth PMOS transistor 504 is coupled to the write selecting word line 505, and a drain of the fourth PMOS transistor 504 is coupled to a second write-in bit line 507.

During the write operation of the memory storage unit 500, the write selecting word line 505 is set to low level GND so that data of the first write-in bit line 506 are written into the storage node Q5 and data of the second write-in bit line 507 are written into the reverse storage node QN5. When a write operation is not performed, the write selecting word line 505 is set to high level VDD, and both the first write-in bit line 506 and the second write-in bit line 507 are pulled up to high level VDD.

Assume current data stored in the memory storage unit 500 is "1", namely the storage node Q5 is high level "1" and the reverse storage node QN5 is low level "0".

During the read operation of the memory storage unit 500, the read selecting word line 508 is set to high level VDD. As the reverse storage node QN5 is low level "0", the second PMOS transistor 502 is opened, and the read selecting word line 508 charges the second read-out bit line 510 through the second PMOS transistor 502. Meanwhile, as the storage node Q5 is high level "1", the first PMOS transistor 501 is cut off and the read selecting word line 508 is unable to charge the first read-out bit line 509. Therefore, a voltage difference is generated between the first read-out bit line 509 and the second read-out bit line 510, which is sensed by a peripheral control circuit and read out.

The read operation of the memory storage unit 500 is non-destructive, namely the data stored in the memory storage unit 500 are not destroyed by the read operation of the memory storage unit 500. Therefore, a write-back operation is not necessary after the read operation. When the read operation is finished, the read selecting word line 508 is set to low level GND, and both the first read-out bit line 509 and the second read-out bit line 510 are pulled down to low level GND.

During the data maintaining of the memory storage unit 500, the write selecting word line 505 is high level VDD. As the first write-in bit line 506 is high level VDD and the storage node Q5 is high level "1", the third PMOS transistor 503 is cut off with no sub-threshold current. As the second write-in bit line 507 is high level VDD and the reverse storage node QN5 is low level "0", the fourth PMOS transistor 504 is cut off with a sub-threshold current flowing from the second write-in bit line 507 to the reverse storage node QN5, which makes the level of the reverse storage node QN5 increase gradually. Therefore, a periodic refresh is required for the memory storage unit 500 to prevent the data in the memory storage unit 500 from being unreadable as a result of attenuation.

In order to prolong the data maintaining time of the memory storage unit 500 before expiration, an aspect ratio of both the third PMOS transistor 503 and the fourth PMOS transistor 504 should be designed as smaller as possible, so as to reduce the sub-threshold current of the third PMOS transistor 503 flowing to the storage node Q5 and the sub-threshold current of the fourth PMOS transistor 504 flowing to the reverse storage node QN5.

The memory storage unit 500 is a dual port pseudo-static storage unit half-locking the stored data functionally. Compared with a conventional dual port SRAM, the number of the transistors of the memory storage unit 500 is reduced by 50%.

Figure 6:
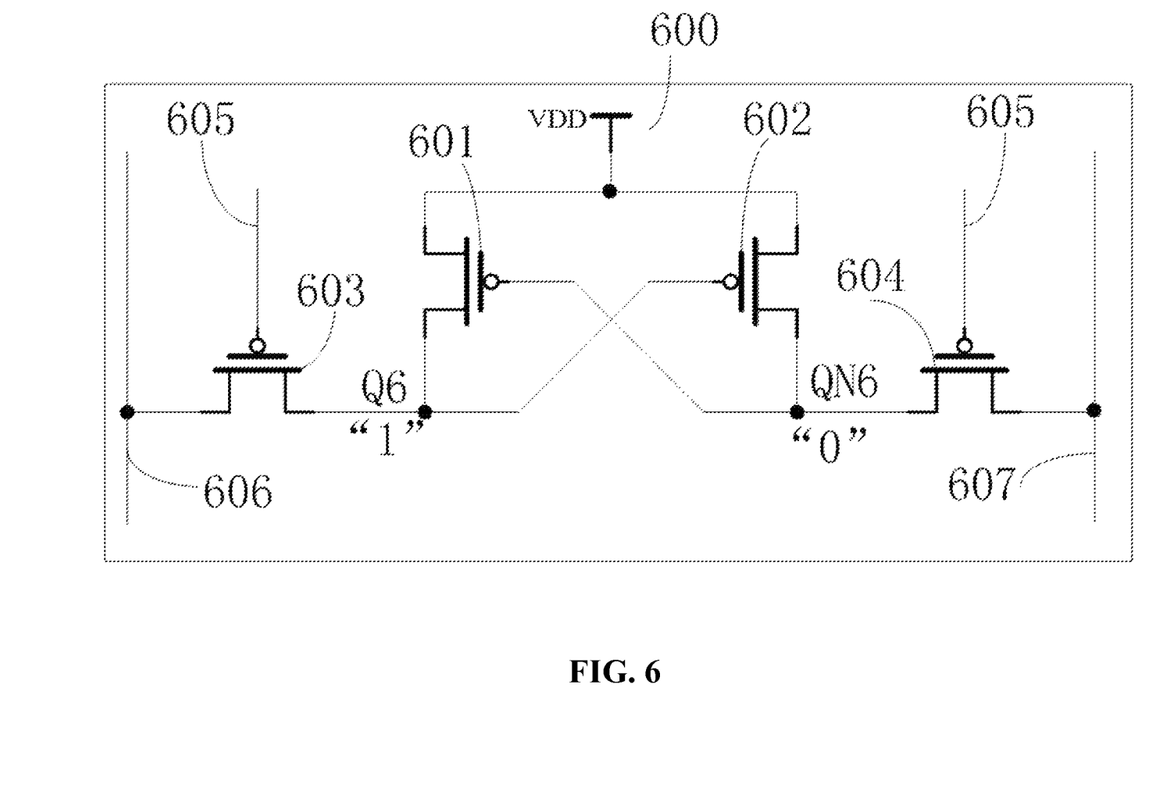
FIG. 6 is a schematic diagram of a radiation-hardened memory storage unit that is resistant to total ionizing dose effects according to another embodiment of the present invention.

FIG. 6 is a schematic diagram of a radiation-hardened memory storage unit that is resistant to total ionizing dose effects according to another embodiment of the present invention. As in FIG. 6, a storage unit 600 comprises 4 PMOS transistors 601-604, and the substrates of all the 4 PMOS transistors are coupled to a voltage VDD.

A first PMOS transistor 601 and a second PMOS transistor 602 are pull-up transistors. A source of the first PMOS transistor 601 is coupled to the voltage VDD, a gate of the first PMOS transistor 601 is coupled to a reverse storage node QN6, and a drain of the first PMOS transistor 601 is coupled to a storage node Q6. A source of the second PMOS transistor 602 is coupled to the voltage VDD, a gate of the second PMOS transistor 602 is coupled to the storage node Q6, and a drain of the second PMOS transistor 602 is coupled to the reverse storage node QN6.

A third PMOS transistor 603 and a fourth PMOS transistor 604 are access transistors. A source of the third PMOS transistor 603 is coupled to the storage node Q6, a gate of the third PMOS transistor 603 is coupled to an access selecting word line 605, and a drain of the third PMOS transistor 603 is coupled to a first bit line 606. A source of the fourth PMOS transistor 604 is coupled to the reverse storage node QN6, a gate of the fourth PMOS transistor 604 is coupled to the access selecting word line 605, and a drain of the fourth PMOS transistor 604 is coupled to a second bit line 607.

During the write operation of the memory storage unit 600, the access selecting word line 605 is set to low level GND so that data of the first bit line 606 are written into the storage node Q6 and data of the second bit line 607 are written into the reverse storage node QN6. When a write operation is not performed, the access selecting word line 605 is set to high level VDD, and both the first bit line 606 and the second bit line 607 are pulled down to low level GND.

Assume current data stored in the memory storage unit 600 is "1", that is the storage node Q6 is high level "1", and the reverse storage node QN6 is low level "0".

During the read operation of the memory storage unit 600, the access selecting word line 605 is set to low level GND. As both the first bit line 606 and the second bit line 607 are low level GND, both the third PMOS transistor 603 and the fourth PMOS transistor 604 are opened. As a result, the charge is redistributed between the first bit line 606 and the storage node Q6 through the third PMOS transistor 603, and the charge is redistributed between the second bit line 607 and the reverse storage node QN6 through the fourth PMOS transistor 604. As the original level of the storage node Q6 is different from that of the reverse storage node QN6, a voltage difference is generated between the first bit line 606 and the second bit line 607 after the charge redistribution, which is sensed by a peripheral control circuit and read out.

The read operation of the memory storage unit 600 is destructive, for the data stored in the memory storage unit 600 are destroyed during the read operation, wherein the charge is redistributed between the first bit line 606 and the storage node Q6 and the charge is redistributed between the second bit line 607 and the reverse storage node QN6. Therefore, a write-back operation is required after the read operation to write the read data back into the memory storage unit 600.

When the read operation is finished, the access selecting word line 605 is set to high level VDD, and both the first bit line 606 and the second bit line 607 is pulled down to low level GND.

During the data maintaining of the memory storage unit 600, as the reverse storage node QN6 is low level "0", the first PMOS transistor 601 is opened and the level of the storage node Q6 is locked at VDD. As the source of the second PMOS transistor 602 is high level VDD, the gate of the second PMOS transistor 602 is high level VDD and the drain of the second PMOS transistor 602 is low level "0", the second PMOS transistor 602 is cut off with a sub-threshold current flowing from the source to the drain of the second PMOS transistor 602, which flowing from the drain of the second PMOS transistor 602 to the reverse storage node QN6. Meanwhile, as the access selecting word line 605 is set to high level VDD, the second bit line 607 is low level GND and the reverse storage node QN6 is low level "0", the gate of the fourth PMOS transistor 604 is high level VDD, the drain of the fourth PMOS transistor 604 is low level GND and the source of the fourth PMOS transistor 604 is low level "0". A sub-threshold current is generated in the fourth PMOS transistor 604 flowing from the reverse storage node QN6 to the second bit line 607. Because of different bias voltages, the sub-threshold current of the fourth PMOS transistor 604 flowing from the reverse storage node QN6 is smaller than the sub-threshold current of the second PMOS transistor 602 flowing to the reverse storage node QN6, which makes the level of the reverse storage node QN6 increase gradually. Therefore, a periodic refresh is required for the memory storage unit 600 to prevent the data in the memory storage unit 600 from being unreadable as a result of attenuation.

In order to prolong the data maintaining time of the memory storage unit 600 before expiration, an aspect ratio of both the first PMOS transistor 601 and the second PMOS transistor 602 should be designed as smaller as possible, so as to reduce the sub-threshold current of the first PMOS transistor 601 flowing to the storage node Q6 and the sub-threshold current of the second PMOS transistor 602 flowing to the reverse storage node QN6.

The memory storage unit 600 is a pseudo-static storage unit half-locking the stored data functionally. Compared with a conventional SRAM, the number of the transistors of the memory storage unit 600 is reduced by 25%.

The memory storage unit of the invention is formed by PMOS transistors, which can realize total ionizing dose radiation hardening automatically with small storage unit area, and therefore can be widely used in anti-radiation aerospace, embedded memories, etc.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A radiation-hardened memory storage unit that is resistant to total ionizing done effects, the unit comprising a first PMOS transistor (401), a second PMOS transistor (402), a third PMOS transistor (403), a fourth PMOS transistor (404), a fifth PMOS transistor (405), and a sixth PMOS transistor (406), wherein said first PMOS transistor (401) and said second PMOS transistor (402) are pull-up transistors; a source of said first PMOS transistor (401) is coupled to a voltage VDD, a gate of said first PMOS transistor (401) is coupled to an reverse storage node (QN4), and a drain of said first PMOS transistor (401) is coupled to a storage node (Q4);

and a source of said second PMOS transistor (402) is coupled to the voltage VDD, a gate of said second PMOS transistor (402) is coupled to the storage node (Q4), and a drain of said second PMOS transistor (402) is coupled to the reverse storage node (QN4); said third PMOS transistor (403) and said fourth PMOS transistor (404) are read-out access transistors; a source of said third PMOS transistor (403) is coupled to a read selecting word line (410), a gate of said third PMOS transistor (403) is coupled to the storage node (Q4), and a drain of said third PMOS transistor (403) is coupled to a first read-out bit line (411); and a source of said fourth PMOS transistor (404) is coupled to the read selecting word line (410), a gate of said fourth PMOS transistor (404) is coupled to the reverse storage node (QN4), and a drain of said fourth PMOS transistor (404) is coupled to a second read-out bit line (412); and said fifth PMOS transistor (405) and said sixth PMOS transistor (406) are write-in access transistors; a source of said fifth PMOS transistor (405) is coupled to the storage node (Q4), a gate of said fifth PMOS transistor (405) is coupled to a write selecting word line (407), and a drain of said fifth PMOS transistor (405) is coupled to a first write-in bit line (408); and a source of said sixth PMOS transistor (406) is coupled to the reverse storage node (QN4), a gate of said sixth PMOS transistor (406) is coupled to the write selecting word line (407), and a drain of said sixth PMOS transistor (406) is coupled to a second write-in bit line (409).

2. The memory storage unit of claim 1, wherein an aspect ratio of each of said first PMOS transistor (401) and said second PMOS transistor (402) is proportional to a retention time of the memory storage unit.

3. The memory storage unit of claim 1, comprising a first PMOS transistor (501), a second PMOS transistor (502), a third PMOS transistor (503), and a fourth PMOS transistor (504), wherein said first PMOS transistor (501) and said second PMOS transistor (502) are read-out access transistors; a source of said first PMOS transistor (501) is coupled to a read selecting word line (508), a gate of said first PMOS transistor (501) is coupled to a storage node (Q5), and a drain of said first PMOS transistor (501) is coupled to a first read-out bit line (509); and a source of said second PMOS transistor (502) is coupled to the read selecting word line (508), a gate of said second PMOS transistor (502) is coupled to an reverse storage node (QN5), and a drain of said second PMOS transistor (502) is coupled to a second read-out bit line (510); and said third PMOS transistor (503) and said fourth PMOS transistor (504) are write-in access transistors; a source of said third PMOS transistor (503) is coupled to the storage node (Q5), a gate of said third PMOS transistor (503) is coupled to a write selecting word line (505), and a drain of said third PMOS transistor (503) is coupled to a first write-in bit line (506); and a source of said fourth PMOS transistor (504) is coupled to the reverse storage node (QN5), a gate of said fourth PMOS transistor (504) is coupled to the write selecting word line (505), and a drain of said fourth PMOS transistor (504) is coupled to a second write-in bit line (507).

4. The memory storage unit of claim 3, wherein an aspect ratio of each of said third PMOS transistor (503) and said fourth PMOS transistor (504) is proportional to a retention time of the memory storage unit.

5. The memory storage unit of claim 1, comprising a first PMOS transistor (601), a second PMOS transistor (602), a third PMOS transistor (603) and a fourth PMOS transistor (604), wherein said first PMOS transistor (601) and said second PMOS transistor (602) are pull-up transistors; a source of said first PMOS transistor (601) is coupled to a voltage VDD, a gate of said first PMOS transistor (601) is coupled to an reverse storage node (QN6), and a drain of said first PMOS transistor (601) is coupled to a storage node (Q6); and a source of said second PMOS transistor (602) is coupled to the voltage VDD, a gate of said second PMOS transistor (602) is coupled to the storage node (Q6), and a drain of said second PMOS transistor (602) is coupled to the reverse storage node (QN6); and said third PMOS transistor (603) and said fourth PMOS transistor (604) are access transistors; a source of said third PMOS transistor (603) is coupled to the storage node (Q6), a gate of said third PMOS transistor (603) is coupled to an access selecting word line (605), and a drain of said third PMOS transistor (603) is coupled to a first bit line (606); and a source of said fourth PMOS transistor (604) is coupled to the reverse storage node (QN6), a gate of said fourth PMOS transistor (604) is coupled to the access selecting word line (605), and a drain of said fourth PMOS transistor (604) is coupled to a second bit line (607).

6. The memory storage unit of claim 5, wherein an aspect ratio of each of said first PMOS transistor (601) and said second PMOS transistor (602) is proportional to a retention time of the memory storage unit.

* * * * *